United States Patent [19]

Higashiyama et al.

[11] 4,380,823

[45] Apr. 19, 1983

[54] MULTI-CHANNEL SIGNAL PROCESSING CIRCUIT FORMED IN A SEMICONDUCTOR INTEGRATED CIRCUIT

[75] Inventors: Naotoshi Higashiyama; Kazuyuki Doi, both of Tokyo, Japan

[73] Assignee: Nippon Electric Co., Ltd., Tokyo, Japan

[21] Appl. No.: 57,370

[22] Filed: Jul. 13, 1979

[30] Foreign Application Priority Data

Jul. 14, 1978 [JP] Japan .................................. 53-86337

[51] Int. Cl.³ .............................................. H04B 1/16
[52] U.S. Cl. ................................... 455/143; 455/188; 455/343
[58] Field of Search ............................... 455/142–144, 455/188–191, 343; 307/303, 465, 467, 41, 126, 130

[56] References Cited

U.S. PATENT DOCUMENTS 3,614,468 10/1971 Ehlbeck et al. ..................... 307/465
4,050,022 9/1977 McFadyen et al. ................. 455/334

OTHER PUBLICATIONS

An AM/FM Radio Subsystem I.C.-Blaser et al, Fairchild Camera & Instruments Corp., Mountain View Calif., May 1977, pp. 129-135, IEEE Trans. on Consumer Electronics.

*Primary Examiner*—Marc E. Bookbinder
*Attorney, Agent, or Firm*—Laff, Whitesel, Conte & Saret

[57] ABSTRACT

A semiconductor chip contains a multi-channel signal-processing circuit for processing signals in different frequency bands (e.g., an AM and an FM receiver). An inductor is coupled via an external terminal on a package for the semiconductor chip to a first signal-processing circuit. A circuit detects when a connection is made between the inductor and a power supply terminal contained in the semiconductor chip. When the inductor is connected to the power supply terminals, the first signal-processing circuit is activated, while the second signal-processing circuit is deactivated. When the inductor is disconnected from the power supply terminal, the second signal-processing circuit is activated, while the first signal-processing circuit is deactivated. The circuit for detecting a connection between the inductor and the power supply terminal is either a circuit for detecting a potential change or a circuit for detecting an oscillating signal. The inductor may be either an oscillator coil or an IF transformer winding.

16 Claims, 5 Drawing Figures

MULTI-CHANNEL SIGNAL PROCESSING CIRCUIT FORMED IN A SEMICONDUCTOR INTEGRATED CIRCUIT

The present invention relates to multi-channel signal processing circuits including circuits for processing signals in different frequency bands, formed on a single semiconductor chip, and more particularly to circuits including an AM receiver circuit and an FM receiver circuit formed on a single semiconductor chip.

In one prior art integrated FM-AM receiver circuit, an FM signal processing circuit and an AM signal processing circuit were formed on a single semiconductor chip. Outputs of the FM and AM signal processing circuits were switched by means of a transfer switch and applied to an audio-frequency and a power amplifier in the subsequent stages. For such switching, the output terminals of the respective signal processing circuits were provided as different external terminals on an integrated circuit chip. The output terminal, which is to be connected to the subsequent stages, was selectively determined by means of the transfer switch. In another prior art circuit, different power supply terminals were provided on an integrated circuit chip for supplying a power source voltage to the respective signal processing circuits. A transfer switch selectively supplied a power source voltage to the power supply terminal of the signal processing circuit.

Here it is to be noted that the term "FM signal processing circuit" generally implies a circuit for electrically processing frequency-modulated signals. However, the art of integrated circuits, it normally implies a signal processing circuit for amplifying an FM-IF signal and for demodulating the amplified FM-IF signal. Or, it could mean a signal processing circuit capable of either amplifying or demodulating. Likewise, the term "AM signal processing circuit" generally implies a circuit for electrically processing amplitude-modulated signals. Again, the art of integrated circuits, it normally implies a signal processing circuit for amplifying an AM-RF signal, producing a local oscillating signal, converting the amplified AM-RF signal into an AM-IF signal, and demodulating the AM-IF signal to become an audio signal. Or, it could mean a signal processing circuit capable of any one of the steps of amplification, of an AM-RF signal, producing a local oscillating signal, frequency-conversion into AM-IF signal and demodulation to an audio signal.

In the above-described FM-AM receiver circuits, the prior art required a great many external terminals for an integrated circuit. Such increased numbers of external terminals in an integrated circuit caused the semiconductor chip or a package to become unnecessarily large and complex. It also increased manufacturing costs, and reduced the integration density and yield.

Therefore, a major object of the present invention is to form a multi-channel signal processing circuit into an integrated circuit for processing signals in various frequency bands, while using fewer external terminals for channel switching.

According to one feature of the present invention, there is provided a multi-channel signal processing circuit, in which first and second signal processing circuits, (which process signals in various frequency bands), are formed on a single semiconductor chip. An inductor is coupled to the first signal processing circuit via an external terminal on the semiconductor chip. Furthermore, a circuit which detects a connection between the inductor and a power supply terminal, is contained in the semiconductor chip.

Further, according to the invention, when the inductor is connected to the power supply terminals, the first signal processing circuit is activated the second signal processing circuit is deactivated. On the other hand, when the inductor is disconnected from the power supply terminal, the second signal processing circuit is activated and the first signal processing circuit is deactivated. Typically, an AM signal processing circuit acts as the first signal processing circuit, while an FM signal processing circuit acts as the second signal processing circuit. Since the circuit for detecting a connection between the inductor and the power supply terminal is applicable, the FM signal-processing circuit also detects a potential change or an oscillation. An oscillator coil or an IF transformer is typically employed as the inductor.

Since inductors, such as the IF transformer and an oscillator coil, cannot be formed in a semiconductor integrated circuit, external terminals are required for connecting these inductors to a semiconductor integrated circuit. The connections between these inductors and the power supply terminal are unnecessary when the signal processing circuit including these inductors is not in use.

The present invention makes use of this feature of the signal processing circuit. The selection of either the first or second signal processing circuit is thus effected depending upon whether or not the power supply terminal is connected to the intermediate frequency transformer or another inductor. Additional external terminals are unnecessary for selecting the signal processing circuits. Further, a single power supply terminal and a single output terminal can be commonly used for all the signal processing circuits, thus saving external terminals. Such a saving of external terminals results in a small-sized semiconductor chip and a package thereof, and it reduces manufacturing costs. Also, further circuit functions can be incorporated in the integrated circuit, extra external terminals can be used for the semiconductor chip and package. Hence, the commercial value of the integrated circuit can be enhanced by reducing the number of terminals used for non-signal processing functions.

BRIEF DESCRIPTION OF THE FIGURES

The above and further objects, features and advantages of the present invention will become more apparent from the following detailed description of embodiments taken in conjunction with the accompanying drawings, wherein.

DESCRIPTION OF THE PREFERRED EMBODIMENTS

Figure 1:
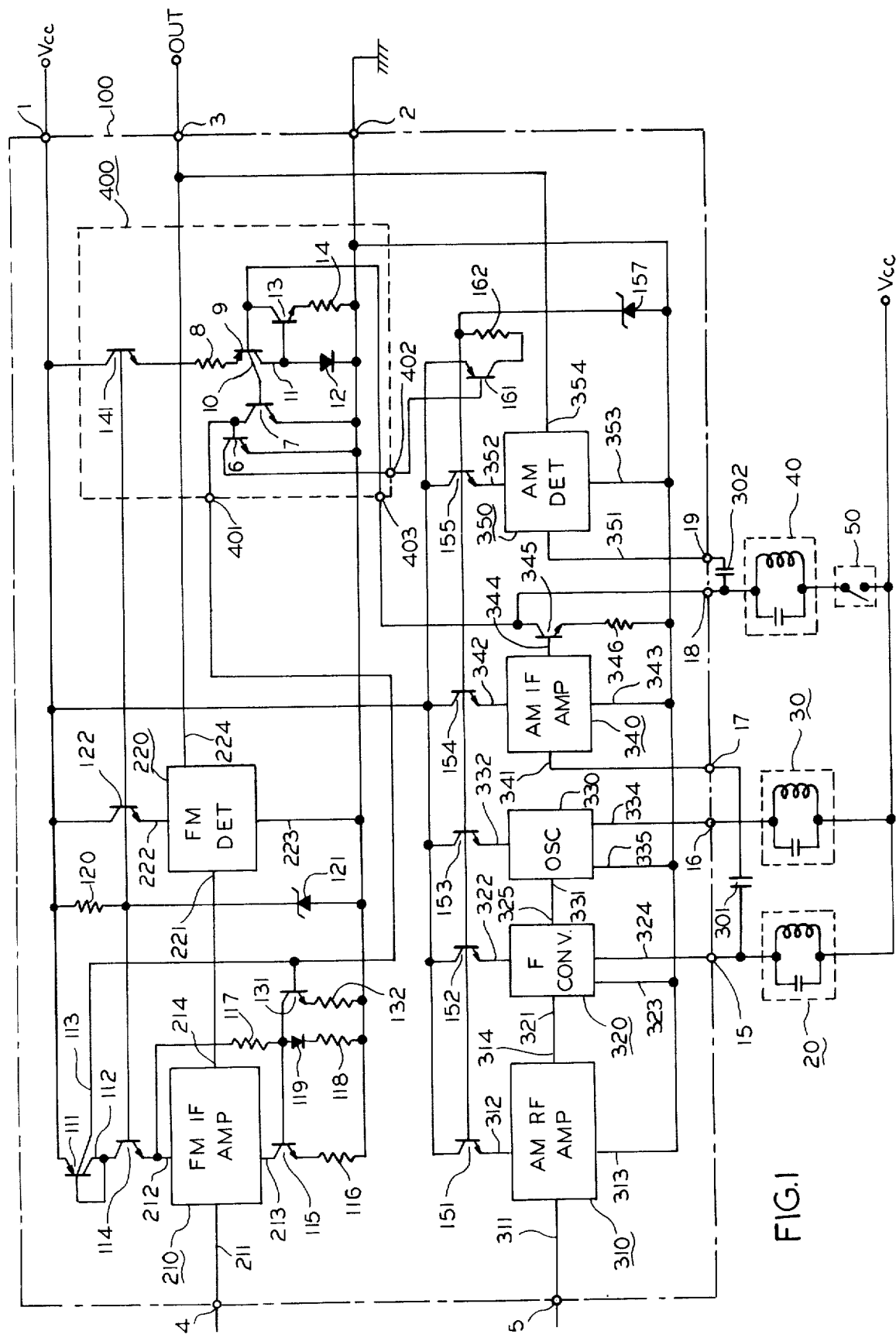
FIG. 1 is a circuit diagram showing a first preferred embodiment of the present invention.

Referring now to FIG. 1 of the drawings, in the first preferred embodiment of the present invention the portion encircled by a dash-dot line frame 100 is an integrated circuit formed on a semiconductor chip. The integrated circuit comprises an FM signal processing circuit which includes an FM intermediate-frequency (FM IF) amplifier 210 and an FM demodulator 220, an AM signal processing circuit including a radio-frequency (RF) amplifier 310, a frequency converter 320, local oscillator 330, an AM intermediate-frequency (AM IF) amplifier 340, an AM demodulator 350, and a switching circuit 400. Moreover, the integrated circuit comprises an FM signal input terminal 4, an AM signal input terminal 5, a power supply terminal 1, a ground terminal 2, and an output terminal 3. It also comprises a tuning circuit connection terminal 15 for the frequency converter 320, an oscillator coil connection terminal 16 for the local oscillator 330, an AM IF signal input terminal 17 for the AM IF amplifier 340, a tuning circuit connection terminal 18 for the AM IF amplifier 340 and an input terminal 19 for the AM demodulator 350.

Each of the tuning circuits 20, 30 and 40 has an inductor and capacitor parallel circuit. One end of each of the tuning circuits 20, 30 and 40 is connected to the connection terminals 15, 16 and 18, respectively. A power supply voltage Vcc is connected directly to the power supply terminal 1 and to the other ends of the tuning circuits 20 and 30, and is supplied through a channel selection switch 50 to the other end of the tuning circuit 40.

An AM IF signal of 455 KHz is derived from the terminal 15, and is applied to the terminal 17 through a capacitor 301. Similarly, the amplified AM IF signal is transferred from the terminal 18 to the terminal 19 by way of a capacitor 302. The FM signal input terminal 4 is connected to an input end of the FM IF amplifier 210, and an output end 214 of the FM IF amplifier 210 is connected to an input end 221 of the FM demodulator 220. Two output ends, that of the FM demodulator 220 and end 354 of the AM demodulator 350, are connected to the output terminal 3 of the integrated circuit.

In more detail, the power supply terminal 1 is connected to a cathode of a Zener diode 121 via a resistor 120. The anode of the Zener diode 121 is connected to the ground terminal 2. The cathode of the Zener diode 121 is connected to the respective bases of npn-transistors 114, 122 and 141. The transistors 114,122 are a power switch for the FM IF amplifier 210 and for the FM demodulator 220. The emitter of the transistor 114 is connected to a first power supply end 212 of the FM IF amplifier 210, and, via a resistor 117, to an anode of a diode 119. The cathode of the diode 119 is connected to the ground terminal 2 through a resistor 118, while the anode of that diode 119 is connected to a base of an npn-transistor 115. The collector of the transistor 115 is connected to a second power supply terminal 213 of the FM IF amplifier 210. The emitter of the transistor 115 is connected to the ground terminal 2 via a resistor 116. The collector of the transistor 114 is connected to a first collector 112 of a npn-transistor 111. This npn transistor has a first collector 112, which is connected to its own base and it also has a second collector 113. The emitter of transistor 111 is connected to the power supply terminal 1, and the second collector 113 is connected to a base of an npn-transistor 131. The collector of the transistor 131 is connected to the anode of the diode 119, and the emitter of transistor 131 is connected to the ground terminal 2 via a resistor 132.

The collector and emitter of the transistor 122 are connected respectively to the power supply terminal 1 and to a first power supply terminal 222 of the FM demodulator 220. A second power supply terminal 223 of the FM demodulator 220 is connected to the ground terminal 2.

The AM signal input terminal 5 is connected to an input end 311 of the RF amplifier 310. The output end 314 of the RF amplifier 310 is connected to an input end 321 of the frequency converter 320, and the output end 324 of the frequency converter 320 is connected through the tuning circuit connection terminal 15 to a tuning circuit 20. The tuning circuit connection terminal 15 is connected via an external capacitor 301 to the input terminal 17 for the AM IF amplifier 340, and the input terminal 17 is connected to an input end 341 of the AM IF amplifier 340. An output end 344 of the AM IF amplifier 340 is connected to a base of an npn-transistor 345 having an emitter connected through a resistor 346 to the ground terminal 2, and a collector connected to the tuning circuit connection terminal 18. The tuning circuit connection terminal 18 is coupled via an external capacitor 302 to the input end 351 of the AM demodulator 350, and to the input terminal 19. An output end 354 of the AM demodulator 350 is connected to the output terminal 2 of the integrated circuit 100.

The power supply terminal 1 is connected to respective collectors of npn-transistors 151, 152, 153, 154 and 155. The respective bases of the npn-transistors 151, 152, 153, 154 and 155 are connected to a cathode of a Zener diode 157 having an anode connected to the ground terminal 2. The emitter of the npn-transistor 151 is connected to a first power supply end 312 of the RF amplifier 310. The emitter of the npn-transistor 152 is connected to a first power supply end 322 of the frequency converter 320, and the emitter of the npn-transistor 153 is connected to a first power supply end 332 of the local oscillator 330. Second power supply ends 313, 323 and 333 of the RF amplifier 310, the frequency converter 320 and the local oscillator 330 are each connected to the ground terminal 2. An end 334 of the local oscillator 330 is connected to the terminal 16 on the integrated circuit 100, which terminal is also used for making a connection to the tuning circuit 30. An output signal at the output end 331 of the local oscillator 330 is supplied to an input end 325 of the frequency converter 320. The emitter of the npn-transistor 154 is connected to a first power supply end 342 of the AM IF amplifier 340. A second power supply end 343 of the AM IF amplifier circuit 340 is connected to the ground terminal 2. In the same way, the emitter of the npn-transistor 155 is connected to a first power supply end 352 of the AM demodulator 350, and a second power supply end 353 of the AM demodulator 350 is connected to the ground terminal 2.

The tuning circuit connection terminal 15, for the frequency converter 320, is connected to an external power supply Vcc through a tuning circuit 20. The terminal 16 is also connected to the external power supply through an oscillator circuit 30. The tuning circuit connection terminal 18 is connected to a tuning circuit 40, and the tuning coil is in turn connected to the external power supply Vcc via an ON-OFF switch 50.

A portion of the integrated circuit 100, which is encircled by a dotted line frame 400, operates as an FM-AM switching circuit. A collector of an npn-transistor 141 is connected to the power supply terminal 1, the base to a cathode of a Zener diode 121, and the emitter to an emitter of a pnp-transistor 9 through a resistor 8. The transistor 9 has two collectors. A first collector 10 is connected to a base of an npn-transistor 7, and a second collector 11 is connected to an anode of a diode 12 and a base of an npn-transistor 13. The cathode of the diode 12 is connected to the ground terminal 2. The emitter of the transistor 7 is directly connected to the ground terminal 2. The collector of the transistor 7 is connected to bases of both an npn-transistor 131, and an npn-transistor 6. Transistor 6 has a grounded emitter. The junction between the collector of the transistor 7 and the base of the transistor 6 forms a first output end 401 of the FM-AM switching circuit 400. The collector of the transistor 6 is connected to a base of a pnp-transistor 161, and forms a second output end 402 of the FM-AM switching circuit 400. The emitter of the transistor 161 is connected to the power supply terminal 1, and the transistor's collector is connected through a resistor 162 to the cathode of the Zener diode 157.

The base of the pnp-transistor 9 is connected to a collector of an npn-transistor 13. The base of the transistor 13 is connected to both the anode of the diode 12, and to the second collector 11 of the pnp-transistor 9. The emitter of the transistor 13 is connected to the ground terminal 2 through a resistor 14. The junction between the base of the transistor 9 and the collector of the transistor 13 is connected to the collector of the transistor 345 through an input end 403 of the FM-AM switching circuit 400.

According to the invention, the FM signal processing circuit is made operative by the voltage potential at the first output end 401 of the FM-AM switching circuit 400. The AM circuit is activated due to the voltage potential at the second output end 402 of the same switching circuit 400. These voltage potentials are charged by the voltage potential at the input end 403 of the FM-AM switching circuit 400. This potential at end 403 depends on whether switch 50 is on or off. Thus the integrated circuit 100 does not need an additional external lead-out terminal for switching between the FM and AM signal-processing circuits. On the contrary, power supply terminals 1 and the output terminal 3 are each formed as a single terminal for both processing circuits, thereby reducing the number of external lead out terminals which are required.

Next, the switching operation will be explained. When integrated circuit 100 is operated with the switch 50 turned ON, the sum of AC and DC voltages at the collector of the npn-transistor 345 is applied to the input end 403 of the switching circuit 400 and to the base of the transistor 9. Then, the emitter-base voltage of the transistor 9 becomes inversely biased, thereby cutting off transistor 9. In this state, since no current is fed to the base of the transistor 7, it is cut off. Then, the cut-off state of the transistor 9 is enhanced by the transistor 13, so that the junction between the base of the transistor 9 and the collector of the transistor 13 has a high impedance as viewed from the collector of the transistor 345. Hence, the signal switching circuit 400 does not influence operation of the AM signal processing circuit. At this time, a current is fed from the second collector 113 of the transistor 111 to the base of the transistor 131. Transistor 131 becomes saturated and depletes the base current of the transistor 115, to cut off that transistor. Consequently the second power supply end 213 of the FM IF amplifier 210 cannot be fed with electric power, and the FM IF amplifier circuit 210 is deactivated. Accordingly, the FM signal processing circuit derives no FM signal processed output at the output terminal 3.

In addition, a current flows from the second collector 113 of the transistor 111 to the base of the transistor 6, thereby enabling transistor 6 to conduct current. Then, since there is a base current for the pnp-transistor 161, the transistor 161 can also conduct current. In this way, a current is fed to the Zener diode 157 through the transistor 161 and the resistor 162. Consequently, currents are fed to the bases of the respective transistors 151, 152, 153, 154 and 155, enabling each of these transistors to conduct current and feed a power supply voltage to the AM signal processing circuit. Hence, the AM signal processing circuit is activated. Accordingly, the AM signal processed output is derived at the output terminal 3. Therefore, in cases where switch 50 is turned ON, the integrated circuit 100 derives an output of the AM signal processing circuit at the output terminal 3. On the other hand, if the switch 50 is turned OFF, the sum of the AC and DC voltages is lowered and applied to the input end 403 of the FM-AM switching circuit 400. This enables transistor 9 to conduct current, and raises the voltage at the base of the transistor 13 which switches on. The current conduction of transistor 9 is enhanced by the collector current of the transistor 13. A current from the first collector 10 of the transistor 9 is fed to the base of the transistor 7, enabling transistor 7 to conduct, and prevent transistor 6 from conducting. When transistor 7 begins to conduct, the current fed to the base of the transistor 131 is decreased. This cuts off transistor 131. Simultaneously, a current is fed to the base of the transistor 115 from the resistor 117, so that the transistor 115 conducts. This transistor is fed with a current from the second power supply end 213 of the FM IF amplifier circuit 210. This causes the FM signal processing circuit to deliver an FM signal processed output at the output terminal 3.

While cut off, transistor 6 does not feed a current to the pnp transistor 161, thereby cutting off pnp transistor 161. The pnp transistor 161 is then unable to feed currents to the respective bases of the transistors 151, 152, 153, 154 and 155, so that the AM signal processing circuit is deactivated and cannot deliver an AM signal processed output at the output terminal 3. Accordingly, when the switch 502 is turned OFF, the integrated circuit 100 delivers an output of the FM signal processing circuit at the output terminal 3.

As described above, by providing the FM-AM switch terminal in common with the tuning coil or circuit connection terminal, an FM-AM receiver circuit can be provided which has a reduced number of external lead out terminals.

In the preferred embodiment (FIG. 1) the tuning circuit connection terminal 18 for the AM IF amplifier 340, and the FM-AM switch terminal are provided in common. An alternative embodiment provides the oscillator coil connection terminal 16, and the FM-AM switch terminal in common.

Figure 2:
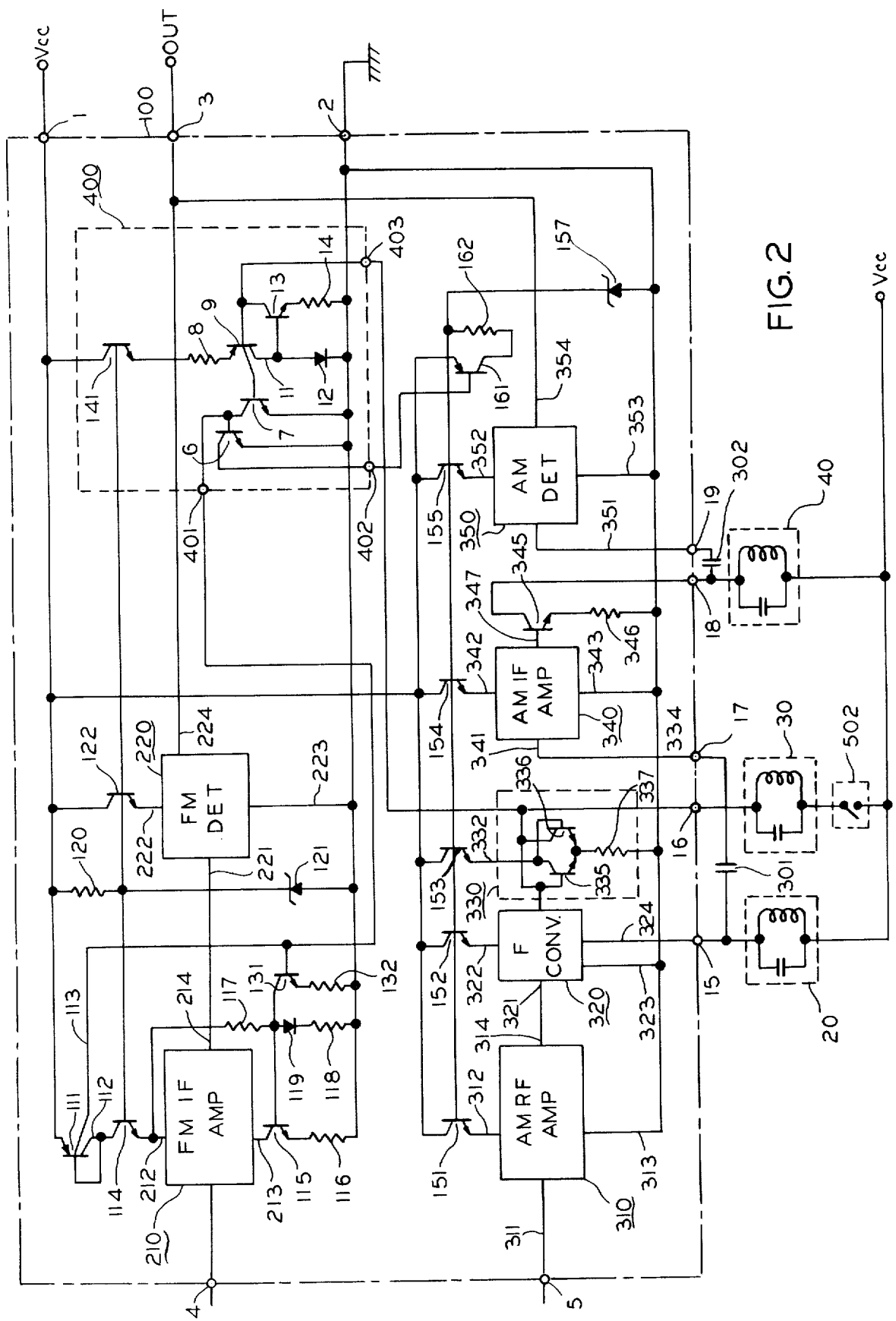
FIG. 2 is a circuit diagram showing a second preferred embodiment of the present invention.

This modification is applied to the second embodiment shown in FIG. 2. The same reference numerals are employed in FIG. 2 for denoting the same part or circuit as in FIG. 1. The basic circuit construction is the same as that of FIG. 1, except that one end of the tuning circuit 40 is directly connected to the power supply line Vcc. The collector of the transistor 345 is disconnected from the input end 403 of the FM-AM switching circuit 400. The FM-AM switch 502 is inserted between the tuning coil circuit 30 and the power supply line Vcc. The local oscillator 330 includes both a differential circuit of npn transistors 335 and 336, and a resistor 337. The base of the transistor 335 is connected to the collector of the transistor 336 and delivers an oscillation output to the frequency converter 320. The base of the transistor 336 is connected to the collector of the transistor 335 and the emitter of the transistor 153. The collector of transistor 336 is also connected to the terminal 16 and the input end 403 of the FM-AM switching circuit 400.

When the switch 502 is ON, the high voltage at the collector of the transistor 336 is applied to the input end 403 of the FM-AM switching circuit 400. The transistors 9 and 7 are cut off; the transistors 131 and 115 turn ON and are cut off, respectively, and then the FM-IF amplifier 210 is deactivated. On the contrary, the transistors 6 and 161 turn ON and enable the transistors 151, 152, 153, 154 and 155 to conduct current. Thus, the AM RF amplifier 310, the frequency converter 320, the local oscillator 330, the AM IF amplifier 340 and the AM demodulator 350 are activated, thereby providing the AM demodulated output at the output terminal 3.

When the switch 502 is cutt off, the lower voltage is applied to the input end 403 of the FM-AM switching circuit 400, and the transistor 9 begins conducting current. The transistor 7 also begins conducting current, causing transistors 131 and 115 to become non-conductive and conductive, respectively. The FM IF amplifier is activated so that the FM demodulated output may be delivered from the output terminal 3. On the contrary, the transistors 6 and 161 become non-conductive, and the transistors 151 to 155 can no longer supply power from their emitters. Consequently, the AM signal processing circuit is deactivated.

Figure 3:
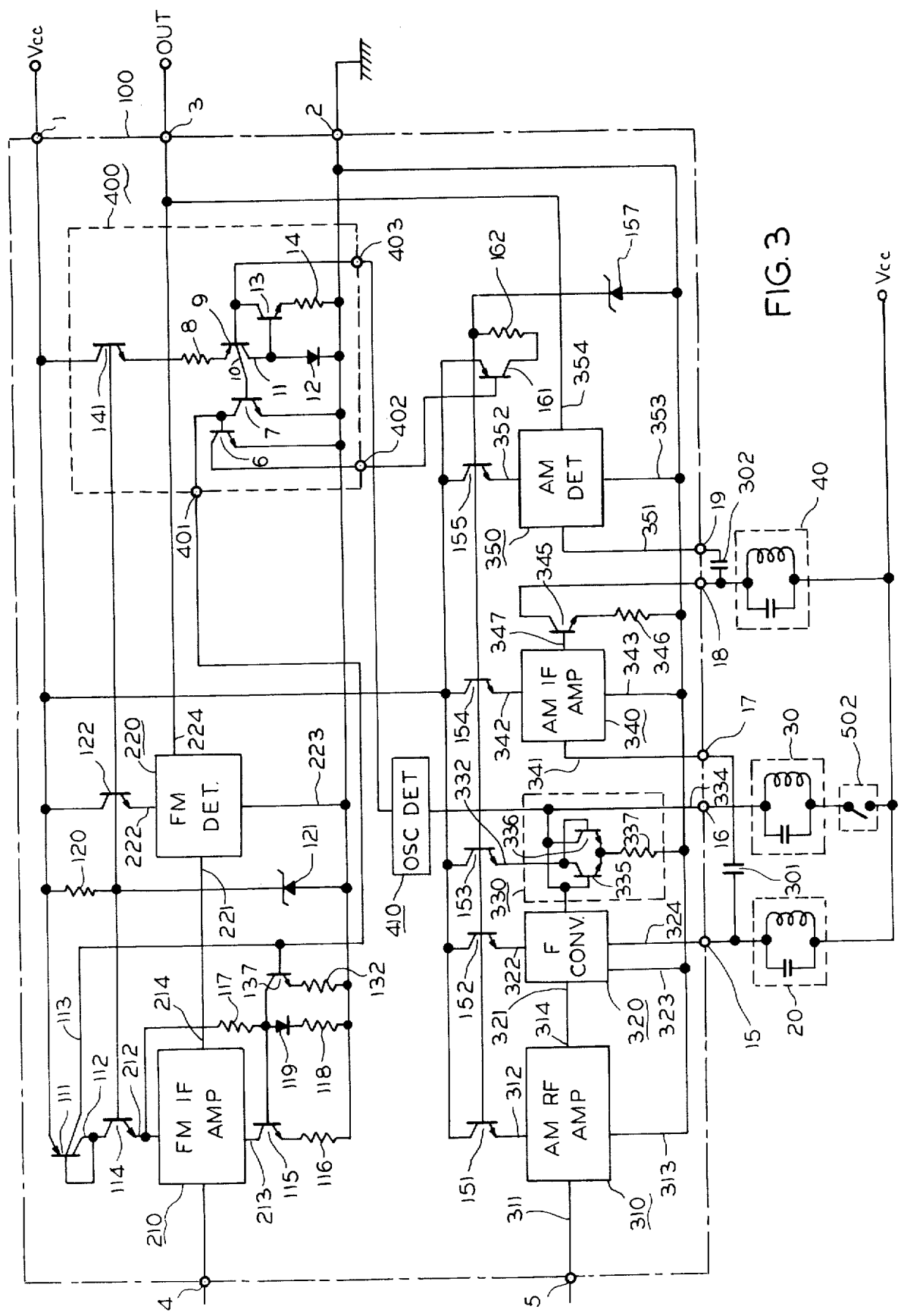
FIG. 3 is a circuit diagram showing a third preferred embodiment of the present invention.

Referring now to FIG. 3, illustrating the third embodiment, the switching between the operations of FM and AM signal processing circuit is achieved responsive to detection of the oscillation output from the local oscillator by means of the oscillation detector 410 which is inserted between the collector of the transistor 336 in the local oscillator 330 and the input end 403 of the FM-AM switching circuit 400. The other construction is similar to that of FIG. 2.

In this embodiment, the oscillation of the local oscillator 330 is provided by closing the switch 502, which makes the voltage at the output end of the oscillation detector 410 high and the transistor 9 conductive. Hence, the AM signal processing circuit begins operating, but the FM signal processing circuit becomes inoperative, as mentioned above. When the oscillation of the local oscillator 330 stops by turning off the switch 502, a lower voltage is provided at the output end of the oscillation detector 410 and applied to the input end 403 of the FM-AM switching circuit 400. The transistor 9 becomes non-conductive. The FM signal processing circuit is deactivated but the AM signal processing circuit is deactivated, as also mentioned above.

Figure 4:
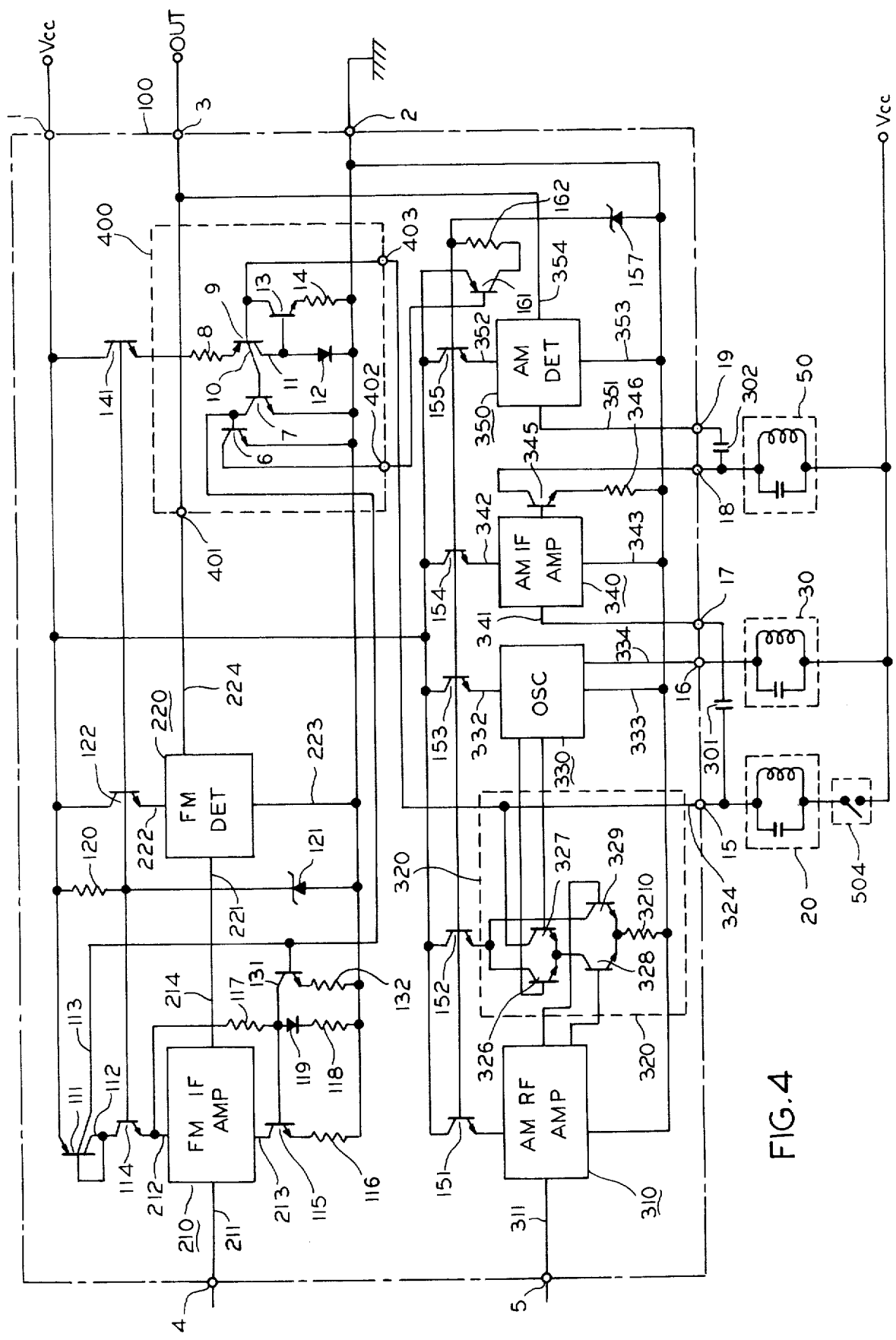
FIG. 4 is a circuit diagram showing a fourth preferred embodiment of the present invention.

Referring now to FIG. 4, the fourth embodiment has an FM-AM switch 504 positioned between the tuning circuit 20 and the power supply line Vcc. The frequency converter 320 is formed by cascade connection of two differential amplifier stages. The lower stage comprises two transistors 328 and 329 and a resistor 3210, and the upper stage comprises two transistors 326 and 327. The AM RF amplifier 310 delivers two outputs having different phases. These outputs are applied to the bases of the transistors 328 and 329. The collector of the transistor 328 is connected to the common emitter of the transistors 326 and 327. Two outputs of the local oscillator 330, which have different phases with respect to each other, are applied to the bases of the transistors 326 and 327. The collectors of the transistors 326 and 329 are commonly connected to the emitter of the transistor 152. The collector of the transistor 329 is connected to the terminal 15 and the input end 403 of the FM-AM switching circuit. The amount of voltage at the input end 403 is regulated by turning switch 504 on and off. The FM-AM switching circuit controls the operation of the FM and AM signal processing circuits (see FIGS. 1 and 2).

Figure 5:
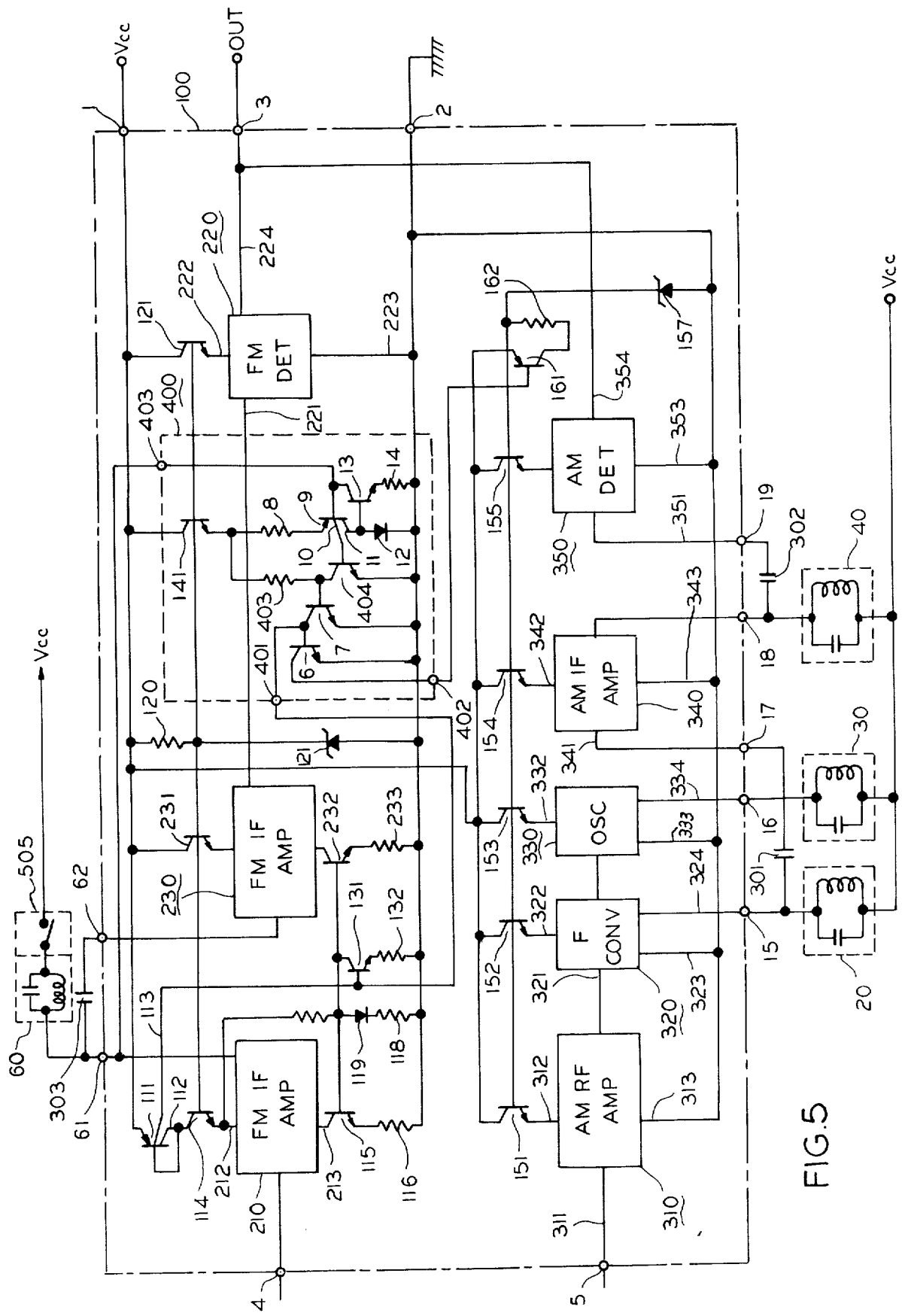
FIG. 5 is a circuit diagram showing a fifth preferred embodiment of the present invention.

With reference to FIG. 5, the fifth embodiment has additional terminals 61 and 62 for connecting turning circuit 60 and the switch 505. The tuning circuit 60 is connected through terminal 61 to both the FM IF amplifier 210 and to the input end 403 of the FM-AM switching circuit 400. The circuit's tuned frequency is 10.7 MHz. The output of the FM IF amplifier 210 is provided at the terminal 61 and is applied to the following FM IF amplifier 230 by way of a capacitor 303 and the terminal 62. The power supply to the FM IF amplifier 230 is controlled by transistors 231 and 232 and by resistor 233. The switch 505 is inserted between the tuning circuit 60 and the power supply line Vcc. It is noted that the additional transistor 404 is inserted between the transistors 9 and 7 of the FM-AM switch circuit 400 to convert the output states at the output ends 401 and 402 with respect to another embodiment.

When the switch 505 is turned on, a raised voltage is applied to the input end 403. The potentials at the output ends 401 and 402 become low and high, respectively. The transistor 131 becomes non-conductive and the transistors 115 and 232 become conductive. In this state, the FM IF amplifiers 210 and 230 are activated and the FM demodulated output is delivered from the output terminal. However the AM RF amplifier 310, the frequency converter 320, the local oscillator 330, the AM IF amplifier 340 and the AM demodulator 350 are deactivated.

When the switch 505 is turned off, a lowered voltage is applied to the input end 403. The potentials at the output ends 401 and 402 become high and low, respectively. Consequently the FM signal processing circuit becomes inoperative and the AM signal processing circuit is activated.

Thus, according to the present invention, a semiconductor integrated circuit does not require special terminals to be used exclusively for switching between circuits. Further, a single output terminal and a single power supply terminal are both required to selectively derive an output signal in a semiconductor integrated circuit. Therefore, the semiconductor integrated circuit requires fewer terminals. This reduces cost and increases production yield. In addition, since the unused terminals can be combined in a semiconductor integrated circuit which is used for another operation, such as noise cancellation, the commercial value of the integrated circuit is enhanced.

What is claimed is:

1. A multi-channel signal-processing apparatus comprising:
   a. a semiconductor chip having a plurality of external lead-out terminals;
   b. first and second signal-processing circuit means for processing signals in various frequency bands, said first and second signal-processing circuits being formed on said semiconductor chip, said first and second signal-processing circuit means being coupled to said external lead-out terminals;
   c. a series connection of an inductor and a switch coupled between one of said external lead-out terminals and one pole of a power supply, said inductor being individually associated with said first signal-processing circuit;

d. means formed on said semiconductor chip and coupled to said series connection for detecting the state of said switch; and e. means formed on said semiconductor chip and coupled to said detecting means and said first and second signal-processing circuit means for activating one of said first and second signal-processing circuits in response to an output of said detecting means, such that when said switch is ON and said inductor is coupled to said one pole of said power supply, then said first signal-processing circuit is activated and said second signal-processing circuit is deactivated, whereas when said switch is OFF said inductor is decoupled from said one pole of said power supply, then said second signal-processing circuit is activated and said first signal-processing is deactivated.

2. A multi-channel signal processing apparatus as claimed in claim 1, in which said detection means includes means for detecting connection between said inductor and said one pole of said power supply in response to a potential charge at said lead-out terminal coupled to said series connection.

3. A muti-channel signal processing apparatus as claimed in claim 2, wherein said inductor is part of an intermediate frequency transformer.

4. A multi-channel signal-processing apparatus as claimed in claim 1, wherein said detecting means includes means for detecting an oscillating signal generated responsive to the inductance of said inductor.

5. A multi-channel signal processing apparatus as claimed in claim 4, wherein said inductor is an oscillator coil.

6. A multi-channel signal processing apparatus as claimed in claim 1, 2, 3, 4 or 5, wherein said first signal processing circuit includes a processing circuit for AM broadcast signals, and said second signal processing circuit includes a processing circuit for FM broadcast signals.

7. A multi-channel signal processing apparatus as claimed in claims 1, 2, 3, 4 or 5, wherein said first signal processing circuit includes a processing circuit for FM broadcast signals, and said second signal processing circuit includes a processing circuit for AM broadcast signals.

8. A system for enabling a use of fewer terminals than a conventionally required number of terminals for an integrated circuit chip, said system comprising:

first means in a semiconductor chip for providing signal processing functions in different frequency bands;

second means connected to one of said fewer terminals and external to said integrated semiconductor chip for modifying said functions, said second means being an inductor, and third means coupled to said first means and said one terminal for modifying said functions in response to an application of power via said second means to said one terminal, said modification comprising a shifting of said functions between said different frequency bands.

9. A system for enabling a use of fewer terminals than a conventionally required number of terminals for an integrated circuit chip, said system comprising:

means first in a semiconductor chip for providing signal processing functions in different frequency bands, the signal processing functions in one of said frequency bands being AM radio reception, the signal processing functions in another of said frequency bands being FM radio reception;

second means connected to one of said fewer terminals and external to said integrated semiconductor chip for modifying said functions, said external means comprising an inductive element of a tuned circuit; and third means coupled to said first means and said one terminal for modifying said functions in response to an application of power via said second means to said one terminal, said modification comprising a shifting of said functions between said AM and FM reception.

10. A system for enabling a use of fewer terminal than a conventionally required number of terminals for an integrated circuit chip, said system comprising:

first means in a semiconductor chip for providing signal processing functions in different frequency bands, the signal processing functions in one of said frequency bands being AM radio reception, the signal processing functions in another of said frequency bands being FM radio reception;

second means connected to one of said fewer terminals and external to said integrated semiconductor chip for modifying said functions, said external means including an inductive element which is at least one winding in an intermediate frequency transformer; and third means coupled to said first means and said one terminal for modifying said functions in response to an application of power via said second means to said one terminal, said modification comprising a shifting of said functions between said AM and FM reception.

11. A method of processing electronic signals comprising the steps of:

a. applying signals to be processed to terminals on a housing of an integrated semiconductor chip;

b. selectively processing, in said chip, said signals in AM or FM frequency bands;

c. selectively and inductively coupling a voltage from a power supply to at least one of said terminals, said selective and inductive coupling being performed externally of said semiconductor chip;

d. detecting the appearance of said voltage from said power supply when applied in step (c); and e. switching signal processing within said semiconductor chip between AM reception and FM reception in response to the voltage detection of step (d).

12. The method of claim 11 wherein said selective and inductive coupling is performed by an inductor means part of a tuned circuit in a receiver in said semiconductor chip, which receiver may operate at one of at least two frequencies.

13. A system comprising:

an integrated circuit chip having a plurality of terminals;

means in said integrated circuit chip for providing signal processing functions in different frequency bands;

means external to said integrated circuit chip for selectively supplying a voltage from a power supply line through an inductive element to one of said terminals; and means in said integrated circuit chip and coupled to said one terminal for shifting said functions between said different frequency bands in response to said voltage.

14. The system of claim 13 wherein the signal processing in one of said frequency bands is AM radio reception.

15. The system of claim 14 wherein the processing in another of said frequency bands is FM radio reception.

16. A signal processing apparatus comprising a semiconductor chip having at least first, second and third terminal pads, said first terminal pad being supplied with a first input signal in a first frequency band, said second terminal pad being supplied with a second input signal in a second frequency band, a first signal processing circuit in said semiconductor chip coupled to said first terminal pad to receive said first input signal, a second signal processing circuit in said semiconductor chip separated from said first signal processing circuit and coupled to said second terminal pad to receive said second input signal, means external to said semiconductor chip and connected to said third terminal pad for supplying a voltage to said third terminal pad in order to activate one of said first and second signal processing circuits, means in said semiconductor chip and coupled to said third terminal for producing a first control signal upon the appearance of said voltage and a second control signal upon the disappearance of said voltage, means in said semiconductor chip responsive to said first control signal for supplying a power voltage to said first signal processing circuit, and means in said semiconductor chip responsive to said second control signal for supplying a power voltage to said second signal processing circuit.

* * * * *